(12) United States Patent
Miyashita et al.

(10) Patent No.: US 8,223,294 B2
(45) Date of Patent: Jul. 17, 2012

(54) ELECTRONIC DEVICE

(75) Inventors: Akihiro Miyashita, Kanagawa (JP); Hideki Kuga, Kanagawa (JP); Takahiro Naruse, Kanagawa (JP)

(73) Assignee: Panasonic Corporation, Osaka (JP)

( * ) Notice: Subject to any disclaimer, the term of this patent is extended or adjusted under 35 U.S.C. 154(b) by 274 days.

(21) Appl. No.: 12/810,794

(22) PCT Filed: Sep. 30, 2008

(86) PCT No.: PCT/JP2008/002751
§ 371 (c)(1),
(2), (4) Date: Jun. 25, 2010

(87) PCT Pub. No.: WO2009/084138
PCT Pub. Date: Jul. 9, 2009

(65) Prior Publication Data
US 2010/0279742 A1    Nov. 4, 2010

(30) Foreign Application Priority Data

Dec. 28, 2007    (JP) .................................. 2007-340768

(51) Int. Cl.
*G02F 1/1333* (2006.01)
(52) U.S. Cl. ............................................ 349/58; 349/61
(58) Field of Classification Search ........................ None
See application file for complete search history.

(56) References Cited

U.S. PATENT DOCUMENTS

| | | | |
|---|---|---|---|
| 6,154,262 A | 11/2000 | Ogura | |
| 2003/0053008 A1 | 3/2003 | Nakano | |
| 2006/0176417 A1* | 8/2006 | Wu et al. | 349/58 |
| 2007/0024771 A1* | 2/2007 | Shinohara et al. | 349/58 |
| 2009/0213534 A1* | 8/2009 | Sakai | 361/679.21 |

FOREIGN PATENT DOCUMENTS

| | | |
|---|---|---|
| JP | 2000200506 A | 7/2000 |
| JP | 2000231096 A | 8/2000 |
| JP | 2002108237 A | 4/2002 |
| JP | 2002148653 A | 5/2002 |
| JP | 2004085633 A | 3/2004 |
| JP | 2005227435 A | 8/2005 |
| JP | 2006195296 A | 7/2006 |
| JP | 2007114325 A | 5/2007 |
| JP | 2007212931 A | 8/2007 |

OTHER PUBLICATIONS

International Search Report relating to International Application No. PCT/JP2008/002751, mailed Nov. 11, 2008, 4 pages.

* cited by examiner

*Primary Examiner* — Hemang Sanghavi
(74) *Attorney, Agent, or Firm* — Seed IP Law Group PLLC

(57) ABSTRACT

Disclosed is an electronic device which is formed thin while maintaining good display by a liquid crystal display unit. Specifically disclosed is an electronic device wherein a main substrate (130) mounted with an electronic component is so arranged as to face a reflecting sheet (126) which is formed on the back surface of a liquid crystal display unit (110). A flexible substrate (140) arranged between the liquid crystal display unit (110) and the main substrate (130) is connected to a surface (132) of the main substrate (130), which surface (132) is on the side of the reflecting sheet (126). A protective sheet (150) covering the reflecting sheet (126) is interposed between the flexible substrate (140) and the reflecting sheet (126).

10 Claims, 9 Drawing Sheets

ELECTRONIC DEVICE

TECHNICAL FIELD

The present invention relates to an electronic device that has a liquid crystal display unit.

BACKGROUND ART

Liquid crystal displays (also "liquid crystal display units") that excel in low power consumption, lightness and thinness are widely used as typical thin displays.

As disclosed in, for example, Patent Document 1, a liquid crystal display employs a configuration in which a reflection plate, a light guide plate, a diffusion plate, a prism sheet that improves brightness and a liquid crystal cell are laminated in order, and in which a light source such as a light emitting diode (LED) and a lamp reflector are arranged on the lateral side of the light guide plate.

As disclosed in Patent Document 1, with an electronic device in which a liquid crystal display having this configuration is mounted, the liquid crystal display is mounted inside the housing by holding an exposed reflection plate by a frame provided inside the housing and by providing a flat portion in the housing and placing the liquid crystal display in this flat portion.

Patent Document 1: Japanese Patent Application Laid-Open No. 2000-200506

DISCLOSURE OF INVENTION

Problems to be Solved by the Invention

Recently, thinness in addition to low power consumption and lightness is demanded for a mobile terminal such as a mobile telephone employing a configuration with a liquid crystal display unit.

To meet this demand, a liquid crystal display and a main substrate are connected through a flexible printed circuit (hereinafter "FPC"), and the main substrate and the FPC are connected using an anisotropic conductive film (hereinafter "ACF"). Then, the main substrate is disposed inside the housing and the liquid crystal display connected to this main substrate through the FPC is arranged on this main substrate in a state where the liquid crystal display is held by the frame as in a conventional attachment structure as disclosed in Patent Document 1.

In a mobile terminal in which the liquid crystal display is attached as described above, there is a demand to make the thickness of the housing thinner without using the same frame as in Patent Document 1 or a holding member such as a flat member receiving a liquid crystal display.

However, with a configuration in which the frame for holding the liquid crystal display is removed and the liquid crystal display is laminated on the substrate inside the housing, there is a concern that the reflection plate that is exposed on the back surface side of the liquid crystal display is damaged by the step formed by the FPC connected on the main substrate, thereby producing unevenness in display such as a white spot phenomenon, on the display surface of the liquid crystal display.

It is therefore an object of the present invention to provide an electronic device that can be made thinner while maintaining good display performance of a liquid crystal display unit.

Means for Solving the Problem

The electronic device according to the present invention employs a configuration which includes: a liquid crystal display unit which comprises a reflecting sheet; a substrate which is arranged to face the reflecting sheet and which mounts an electronic component on a surface opposite to a surface on a reflecting sheet side; a flexible substrate which is provided between the liquid crystal display unit and the substrate, and which is connected to the substrate; and a protective sheet which is provided between the reflecting sheet and the flexible substrate.

Advantageous Effects of Invention

The present invention can be made thinner while maintaining good display performance of a liquid crystal display module.

BEST MODE FOR CARRYING OUT THE INVENTION

Hereinafter, embodiments of the present invention will be explained in detail with reference to the accompanying drawings.

Embodiment 1

Figure 1:
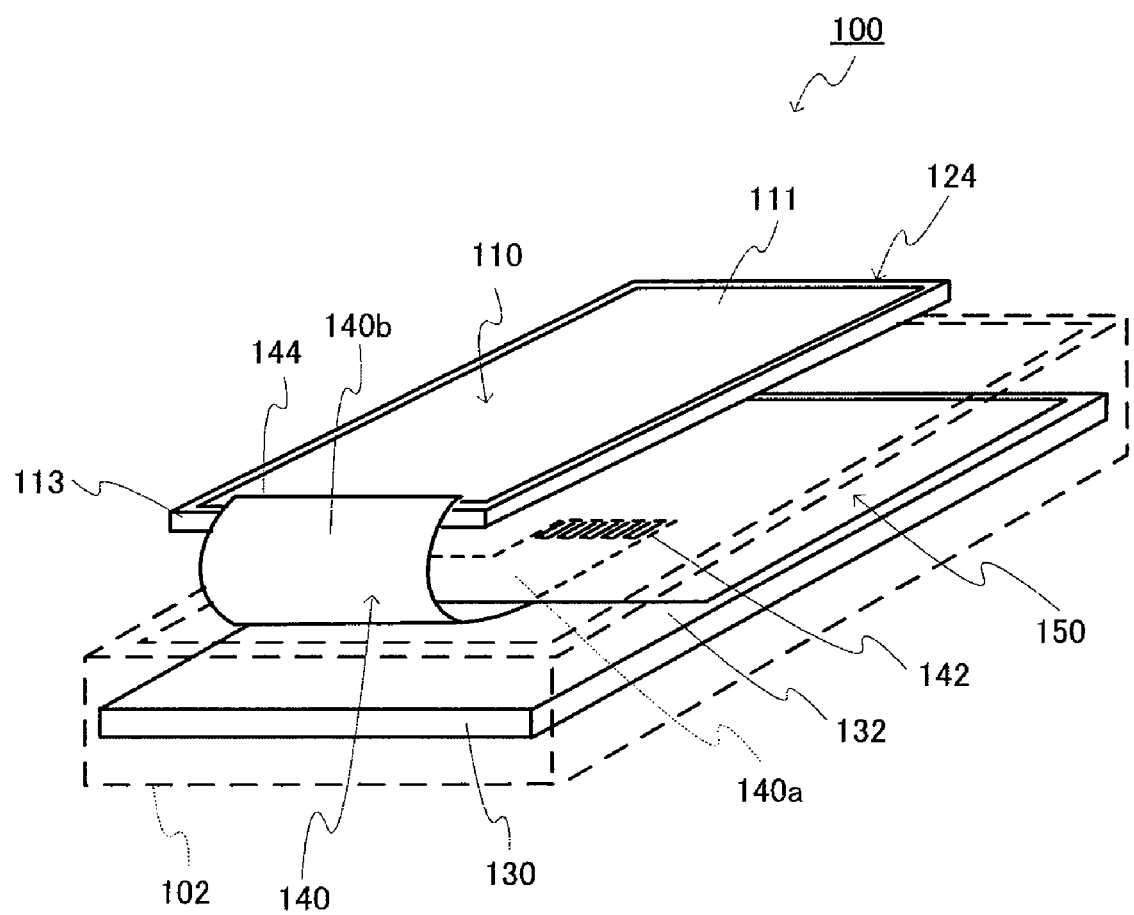
FIG. 1 is a partial exploded perspective view showing a liquid crystal display module and a main substrate arranged in an electronic device according to Embodiment 1 of the present invention.
Figure 2:
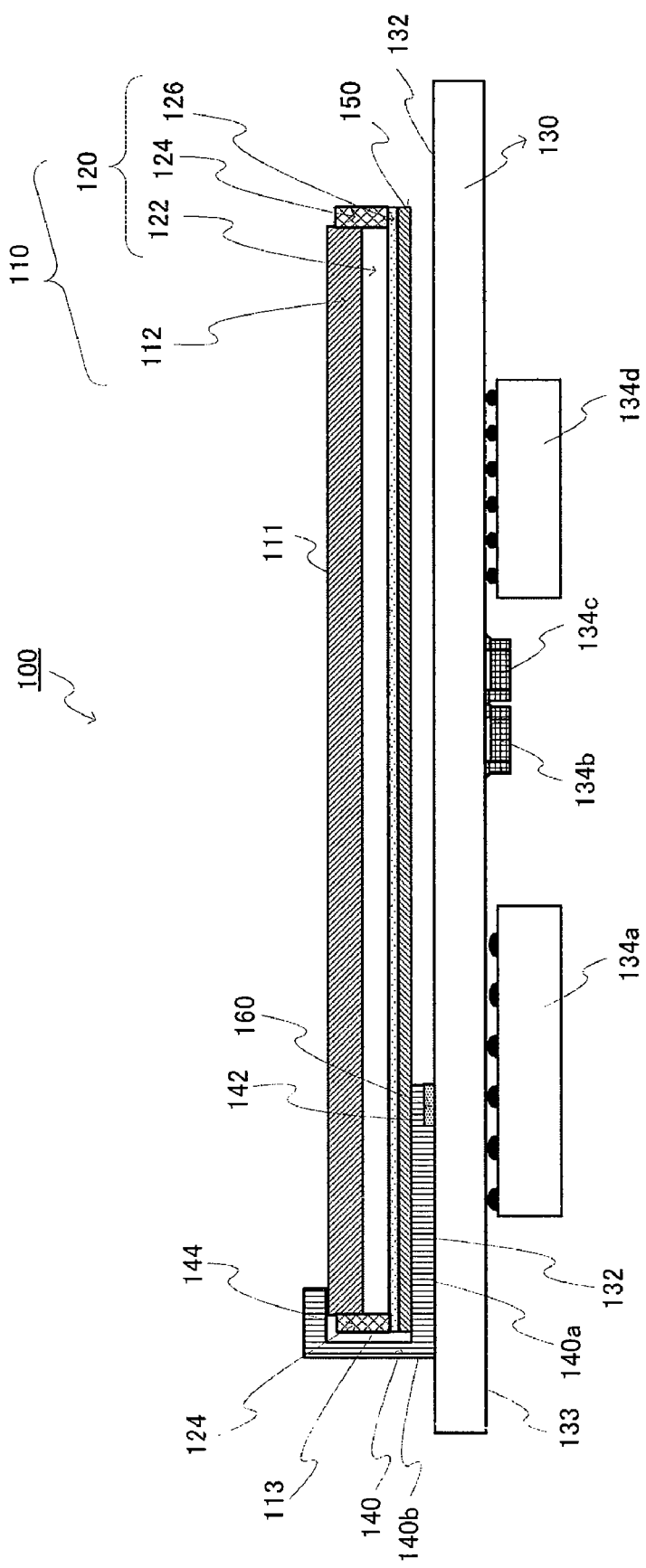
FIG. 2 is a partial cross-sectional view showing the liquid crystal display module and the main substrate provided in the electronic device according to Embodiment 1 of the present invention.

FIG. 1 is a partial exploded perspective view showing a liquid crystal display module and a main substrate arranged in an electronic device according to Embodiment 1 of the present invention, and FIG. 2 is a partial cross-sectional view showing the liquid crystal display module and the main substrate provided in the electronic device according to Embodiment 1 of the present invention.

Electronic device 100 shown in FIG. 1 is a mobile terminal such as a mobile telephone that has liquid crystal display unit 110 including a liquid crystal display module.

In this electronic device 100, main substrate 130 and liquid crystal display unit 110 that is connected to main substrate 130 through FPC 140 are laminated and arranged on opposite sides of protective sheet 150, inside housing 102.

Main substrate 130 is a printed substrate, and is connected electrically with FPC 140 through a planar connecting part that is arranged on one surface 132 (hereinafter "surface") facing the liquid crystal display unit in the body part that is an insulating plate.

The planar connecting part (not shown) such as a pad provided on the surface 132 side of main substrate 130 is connected to a wiring portion (not shown) provided on the back surface 133 side of main substrate 130 through a throughhole penetrating the body part of main substrate 130. In the wiring portion disposed in other surface 134 (hereinafter "back surface") of main substrate 130, electronic parts 134*a* to 134*d* for implementing the functions provided in mobile terminal 100 are mounted as shown in FIG. 2.

The connecting part provided on the surface 132 side of main substrate 130 is connected through ACF 160 by surface contact with connecting terminal part 142 (see FIG. 1) formed at one end part of FPC 140. That is, liquid crystal display unit 110 and main substrate 130 are connected without using a connector, and the connecting portion formed with the connecting part of main substrate 130, ACF 160 and connecting terminal part 142 of FPC 140 has a planar shape and the height thereof is made as low as possible.

FPC 140 has connecting terminal part 142 at the tip part of one end part 140*a* arranged between liquid crystal display unit 110 and main substrate 130, and its extending part 140*b* side that extends in one direction along main substrate 130 from one end part 140*a* is folded back. FPC 140 is connected to liquid crystal display unit 110 through end part 144 (i.e. other end part) of extending part 140*b* that is folded back.

Liquid crystal display unit 110 has: planar liquid crystal display module 112 that has a liquid crystal driving part and a liquid crystal body which has a plurality of liquid crystal cells sandwiched between glasses, and that uses one surface for display surface 111; and backlight module 120 that is attached on the other surface side (i.e. back surface) of liquid crystal display module 112 and that holds this liquid crystal display module 112.

Here, liquid crystal display module 112 has a flat, rectangular shape, and light is radiated upon liquid crystal display module 112 by surface emission from backlight module 120 arranged to face the other surface (i.e. back surface) side that is the opposite side of display surface 111.

Backlight module 120 has: surface emitting part 122 that includes a rectangular light guide plate arranged in the back surface of above liquid crystal display module 112 so as to cover an effective display area in liquid crystal display module 112; backlight frame parts 124 that hold surface emitting part 122 and liquid crystal display module 112; and reflecting sheet 126.

Surface emitting part 122 is attached over the entire surface of the back surface of liquid crystal display module 112, and performs surface emission by means of light radiated upon the interior of surface emitting part 122 from the light source such as an LED (not shown) arranged in the lateral end surface of the light guide plate that performs surface emission. Further, surface emitting part 122 is formed by laminating in the light guide plate a diffusion sheet, two prism sheets (light collection sheets) and a rim sheet in order, over the entire surface on the liquid crystal display module 112 side (i.e. surface) facing liquid crystal display module 112.

The diffusion sheet attached on the surface of the light guide plate in surface emitting part 122 allows transmission of incident light and diffuses incident light, and the prism sheet adjusts the traveling direction of incident light to a direction orthogonal to the light emitting surface, to output light.

Further, the rim sheet of surface emitting part 122 is a double-sided adhesive tape having the light blocking effect, and is configured such that light emitted from surface emitting part 122 radiates upon the effective display area (i.e. the area in which images are displayed) of liquid crystal display module 112. In this way, backlight module 120 is pasted integrally with liquid crystal display module 112 through the rim sheet. Further, reflecting sheet 126 is attached on the back surface opposite to the surface on the liquid crystal display module 112 side.

Further, the frame parts of backlight frame parts 124 arranged around surface emitting part 122 hold surface light emitting part 122 and liquid crystal display module 112 laminated on surface emitting part 122.

Reflecting sheet 126 is pasted on surface emitting part 122, that is, on the portion matching at least an active area of the display surface (here, the entire surface), and is subjected to surface treatment such that light coming from a direction substantially parallel to the surface that serves as the pasting surface, is reflected in a direction orthogonal to this surface. By this means, reflecting sheet 126 reflects light inside the light guide plate, from the back surface of the light guide plate to the surface (i.e. light emitting surface) of the light guide plate. Further, the light source may be fixed to the end surface of the light guide plate to illuminate the interior of the light guide plate from the end surface of the light guide plate. Furthermore, the light source may be configured to be attached to the frame parts of backlight frame parts 124 to emit light to the light guide plate from the end surface of the light guide plate.

Still further, in liquid crystal display unit 110, a liquid crystal driving circuit (not shown) of liquid crystal display module 112 and the light source (not shown) of backlight module 120 are connected electrically to end part 144 (i.e. other end part of FPC 140) of extending part 140*b* of FPC 140.

To be more specific, on the one end surface 113 side of liquid crystal display unit 110, extending part 140*b* of FPC 140 in electronic device 100 of Embodiment 1 extends from the rim part of one end surface 113 on the display surface 111 side to the back surface side (that is, to the reflecting sheet 126 side), and is bent so as to cover one end surface 113. By this means, inside housing 102, FPC 140 is arranged on main substrate 130 in a state where FPC 140 is folded back so as to surround one end surface 113 of liquid crystal display unit 110.

Protective sheet 150 is arranged between liquid crystal display unit 110 and one end part 140*a* that is provided between liquid display unit 110 and main substrate 130 in FPC 140 arranged in this way.

Protective sheet 150 covers the step formed by the thickness of end part 140*a* of FPC 140 arranged on main substrate 130. In main substrate 130, this protective sheet 150 is arranged so as to cover at least the display area portion in reflecting sheet 126 and cover the portion connected with FPC 140. With the present embodiment, protective sheet 150 is formed in a planar shape having the size matching the entire surface of the area facing liquid crystal display unit 110, and is arranged so as to cover this area facing liquid crystal display unit 110. Further, protective sheet 150 is attached on the main substrate side, and is attached through a planar adhesive member such as a double-sided tape.

Protective sheet 150 is made of a material harder than FPC 140, or may be made of a material having flexibility such as PET (Poly Ethylene Terephthalate). Here, for protective sheet 150, a thermal diffusion sheet such as a graphite sheet having a thickness of, for example, 50μ and 100μ and having high thermal conductivity and thermal diffusivity is used. By this means, inside housing 102, protective sheet 150 diffuses the heat of FPC 140 and the heat of main substrate 130 due to the radiation of heat upon operations in electronic components 134a to 134d, and reduces the heat generated by main substrate 130 itself.

Reflecting sheet 126 forming the back surface of backlight module 112 that attaches surface emitting part 122 on the top surface of the light guide plate is laminated on this protective sheet 150 on main substrate 130.

As described above, with electronic device 100, inside housing 102, FPC 140 connected to surface 132 of main substrate 130 is provided between liquid crystal display unit 110 which includes reflecting sheet 126 in its back surface and main substrate 130 which arranges surface 132 to face reflecting sheet 126 and in which electronic components 134a to 134d are mounted on mounting plane 133 that is the back surface. Further, protective sheet 150 is provided between reflecting sheet 126 and FPC 140.

That is, reflecting sheet 126 forming the back surface that is the surface opposite to display surface 111 of liquid crystal display unit 110 is placed on protective sheet 150 on main substrate 130 that includes the step formed by the thickness of FPC 140 formed by connecting FPC 140 to ACF 160.

In this way, reflecting sheet 126 is disposed on the step formed by the thickness of FPC 140 that is made smooth by the thickness and flexibility of laminated protective sheet 150, and therefore is not damaged by the corner part of the step.

Consequently, with electronic device 100, it is possible to overlay and arrange main substrate 130 and liquid crystal display unit 110 adequately inside the housing without influencing the functions of liquid crystal display unit 110, and make electronic device 100 itself thinner.

Further, electronic device 100 may employ a configuration in which the thickness of protective sheet 150 is made virtually the same as the thickness of FPC 140, a notch matching the shape of part 140a of FPC 140 arranged on main substrate 130 is formed and part 140a of FPC 140 is arranged inside this notch. That is, a configuration is possible in which protective sheet 150 in which a notch matching the shape of FPC 140 is formed and which covers reflecting sheet 126 of liquid crystal display unit 110 so as to be coplanar with the surface of FPC 140 on the liquid crystal display unit 110 side is provided between liquid crystal display unit 110 and main substrate 130.

According to this configuration, by arranging protective sheet 150 on the same plane with FPC 140 projecting above main substrate 130 from the surface of main substrate 130, it is possible to make the surface of this FPC 140 coplanar with the surface of protective sheet 150. That is, the notch part of protective sheet 150 can absorb the step formed by the portion connecting FPC 140 and main substrate 130, so that it is possible to make flat the plane on which reflecting sheet 126 of liquid crystal display unit 110 arranged on protective sheet 150 on main substrate 130 is placed. Consequently, it is possible to make housing 102 thinner and smaller by arranging liquid crystal display unit 110 on main substrate 130 without damaging reflecting sheet 126.

Embodiment 2

Figure 3:
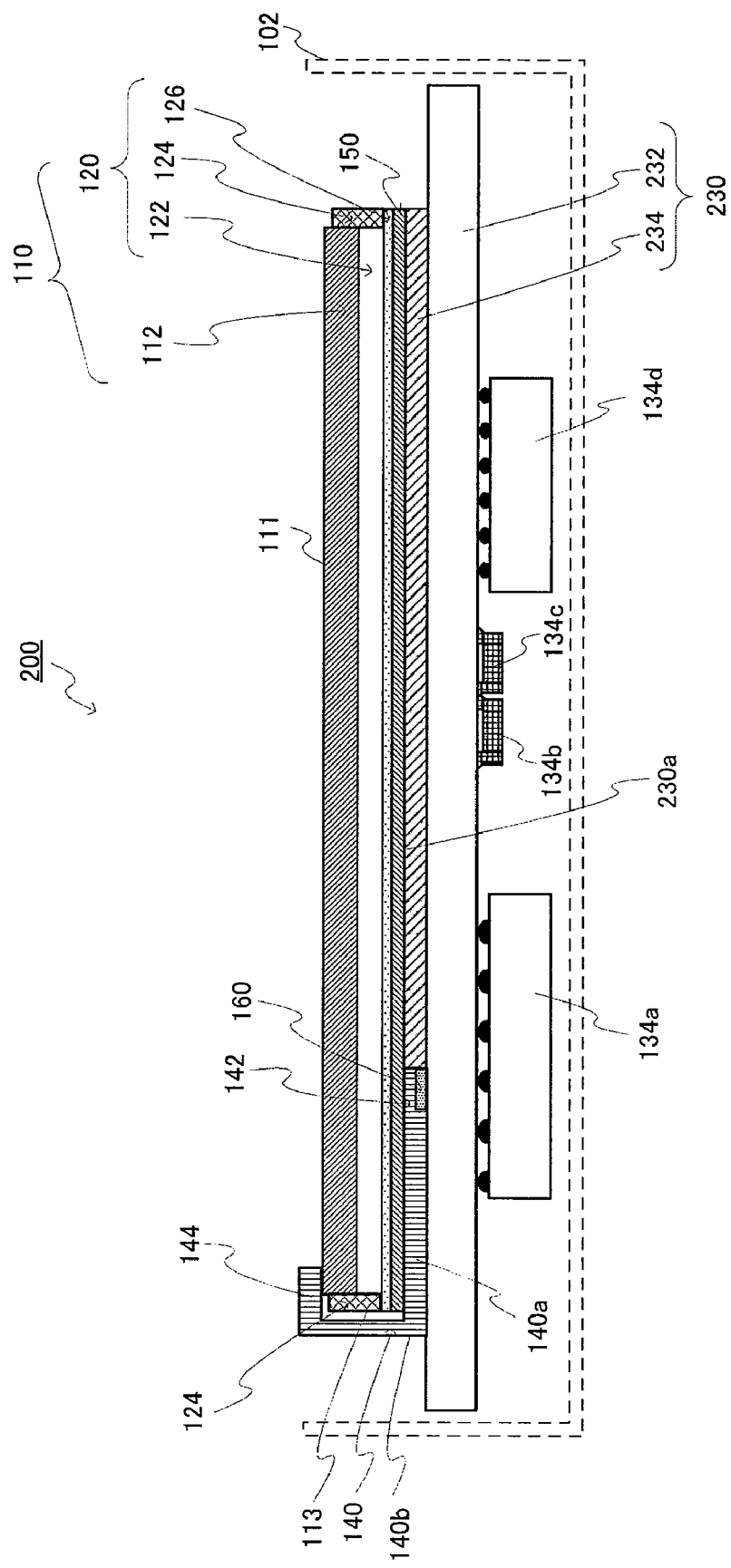
FIG. 3 is a partial cross-sectional view showing a liquid crystal display module and a main substrate provided in an electronic device according to Embodiment 2 of the present invention.
Figure 4:
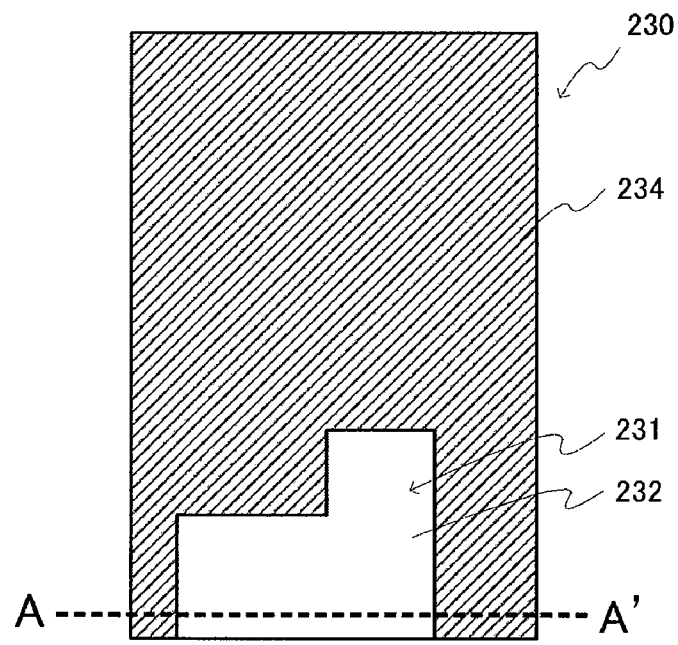
FIG. 4 is a plan view of the main substrate of the electronic device according to Embodiment 2 of the present invention.
Figure 5:
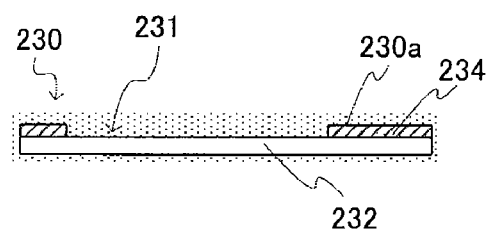
FIG. 5 is a cross-sectional view of the main substrate of FIG. 4 seen from line A-A'.

FIG. 3 is a partial cross-sectional view showing a liquid crystal display module and a main substrate provided in an electronic device according to Embodiment 2 of the present invention, FIG. 4 is a plan view of the main substrate of the electronic device according to Embodiment 2 of the present invention and FIG. 5 is a cross-sectional view of the main substrate of FIG. 4 seen from line A-A'.

Please note that electronic device 200 according to Embodiment 2 differs from corresponding electronic device 100 according to Embodiment 1 shown in FIG. 1 only in the configuration of main substrate 230, and the other components are the same. Therefore, the same components will be assigned the same reference numerals, and explanation thereof will be omitted.

That is, with electronic device 200, inside housing 102, FPC 140 connected on the surface side of main substrate 230 is provided between liquid crystal display unit 110 which includes reflecting sheet 126 in its back surface and main substrate 230 which arranges its surface to face reflecting sheet 126 and in which electronic components 134a to 134d are mounted on the mounting surface that is the back surface. Further, protective sheet 150 is provided between reflecting sheet 126 and FPC 140.

In the surface of main substrate 230 provided in electronic device 200 on which liquid crystal display unit 110 is placed, notch part 231 (see FIG. 4 and FIG. 5) that opens toward one surface 230a (i.e. display surface) is provided to match the shape of one end part of FPC 140 overlaid on main substrate 230.

Here, notch part 231 is formed on main substrate 230 by cutting laminated coverlay 234 applied to the surface of flat, rectangular base material 232 (i.e. insulating plate) made of an insulating member on which liquid crystal display unit 110 is placed.

Inside this notch part 231, a connecting part of a wiring to be connected to connecting terminal part 142 provided in one end part 140a of FPC 140 is disposed, and connecting terminal part 142 is connected electrically to this connecting part through ACF 160.

The connecting portion formed with these connecting terminal part 142 of FPC 140, ACF 160 and the connecting part of main substrate 230 has virtually the same thickness as the thickness of main substrate 230 or is accommodated within the thickness of main substrate 230.

By this means, FPC 140 to be connected to main substrate 230 is arranged without projecting toward liquid crystal display unit 110 beyond surface 230a of main substrate 230, thereby making surface 230a of main substrate 230 connected with FPC 140 virtually a planar surface.

On the surface 230a side of main substrate 230 connected with FPC 140 through ACF 160 as described above, protective sheet 150 is laid.

Similar to Embodiment 1, protective sheet 150 is attached to reflecting sheet 126 forming the back surface of liquid crystal display unit 110 so as to cover at least the effective display area in the surface of liquid crystal display unit 110.

Here, in surface 230a (i.e. surface on the display surface side of liquid crystal display unit 110) of main substrate 230, protective sheet 150 is laid over the entire surface of the area that liquid crystal display unit 110 overlaps.

With this electronic device 200, liquid crystal display unit 110 is laminated on protective sheet 150 on one surface 230a of main substrate 230 on which electrically connected FPC 140 is disposed inside notch part 231.

That is, reflecting sheet 126 that is the back surface of liquid crystal display unit 110 is arranged on protective sheet 150 arranged on one surface 230*a* (i.e. the surface on the display surface side, that is, "surface") of virtually flat main substrate 230 in which FPC 140 is disposed inside notch part 231.

By this means, by overlaying liquid crystal display unit 110 on main substrate 230, it is possible to reduce the length (i.e. thickness) in the vertical direction with respect to display surface 111 in electronic device 200 with liquid crystal display unit 110, and make housing 102 thin as much as possible.

Figure 6:
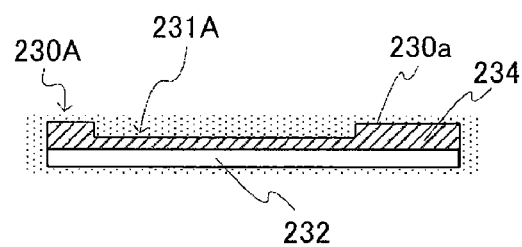
FIG. 6 shows a modified example of the main substrate of the electronic device according to Embodiment 2 of the present invention.

Further, as in main substrate 230A shown in FIG. 6, notch part 231 in electronic device 200 may be formed in laminated coverlay 234 applied on base material 232, by cutting a part that one end part of FPC 140 overlaps, into a shape matching the shape of this one end part. The depth of notch part 231A formed by cutting coverlay 234 in this way is thicker than the thickness of FPC 140. By this means, the surface (surface on the display surface side) at one end part of FPC 140 arranged inside notch part 231 is virtually coplanar with the surface of coverlay 234, that is, with surface 230*a* of main substrate 230, or is lower than surface 230*a* of main substrate 230.

Therefore, with the structure in which liquid crystal display unit 110 is disposed on FPC 140 on main substrate 230A, reflecting sheet 126 is arranged on protective sheet 150 that absorbs convexities and concavities on the surface, on the surface of main substrate 230A that is made virtually flat and that does not have a step formed by FPC 140. Consequently, in the structure in which liquid crystal display unit 110 is laminated on main substrate 230A to which FPC 140 is connected, it is possible to prevent reflecting sheet 126 of liquid crystal display unit 110 overlaid and arranged on main substrate 230 from being damaged.

Further, electronic device 200 may employ a configuration in which a notch matching the shape of part 140*a* of FPC 140 arranged inside notch part 231 of main substrate 230 is formed in protective sheet 150, and part 140*a* of FPC 140 is arranged inside this notch. According to this configuration, in case where FPC 140 projects toward liquid crystal display unit 110 from surface 230*a* of main substrate 230, protective sheet 150 can absorb this projecting portion to make the surface of protective sheet 150 coplanar with the surface of FPC 140. That is, it is possible to make flat the surface on which reflecting sheet 126 of liquid crystal display unit 110 arranged on protective sheet 150 on main substrate 230 is placed. Consequently, it is possible to arrange liquid crystal display unit 110 on main substrate 130 without damaging reflecting sheet 126, and make housing 102 thinner and smaller.

Figure 7:
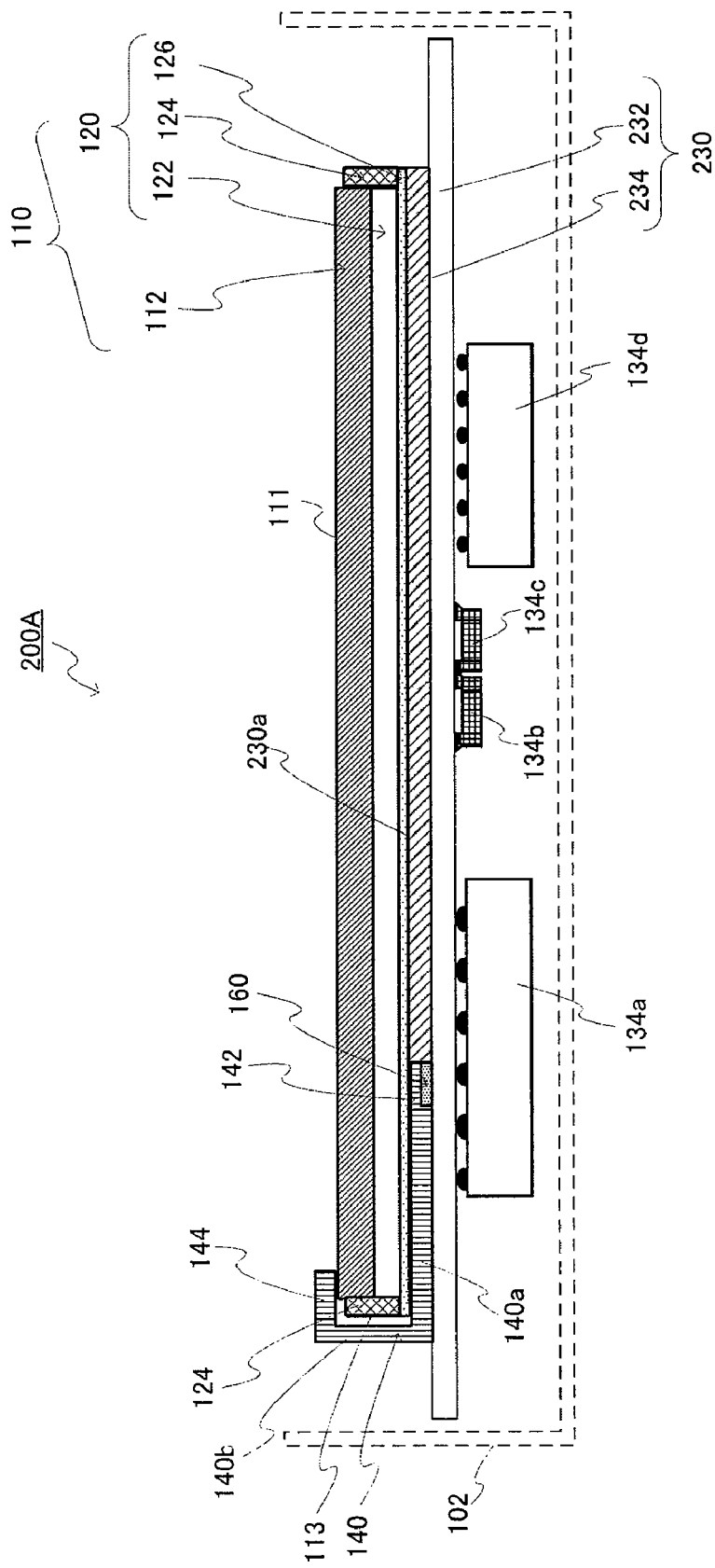
FIG. 7 is a main part cross-sectional view showing the configuration of the electronic device as a modified example of Embodiment 2 of the present invention.

Further, electronic device 200 of Embodiment 2 may employ a configuration without protective sheet 150 as shown in FIG. 7.

FIG. 7 is a main part cross-sectional view showing a configuration of the electronic device as a modified example of Embodiment 2 of the present invention.

With electronic device 200A shown in FIG. 7, liquid crystal display unit 110 is directly placed on main substrate 230 disposed inside housing 102.

With this electronic device 200A, liquid crystal display unit 110 is overlaid and arranged directly on the surface of main substrate 230 in which FPC 140 is disposed inside notch part 231.

According to this configuration, the portion for connecting main substrate 230 and FPC 140 is disposed inside notch part 231 (see FIG. 4 and FIG. 5) so as to make the connecting portion coplanar with surface 230*a* of main substrate 230 in the range of the thickness of main substrate 230. Further, FPC 140 connected to main substrate 230 at the connecting portion is connected to the part on the surface 111 side of liquid crystal display unit 110, through end part 144 (i.e. the other end part of FPC 140) of extending part 140*b* that is led outward from notch part 231 and that is folded back.

That is, FPC 140 provided between main substrate 230 and liquid crystal display unit 110 is arranged so as to make FPC 140 virtually coplanar with surface 230*a* of main substrate 230 in the layer formed by coverlay 234 on base material 232 in main substrate 230, that is, in the range of the thickness of main substrate 230. Consequently, liquid crystal display unit 110 laminated directly on main substrate 230 is arranged on virtually smooth surface 230*a* of main substrate 230.

Thus, even if reflecting sheet 126 forming the back surface of liquid crystal display unit 110 is placed on surface 230*a* of main substrate 230 connected with FPC 140, reflecting sheet 126 is not damaged by the corner part of the step formed by the thickness of end part 140*a* of FPC 140 arranged on main substrate 130, and thereby allows the backlight module to perform adequate surface emission. Further, even if main substrate 230 is replaced with main substrate 230A, it is possible to provide the same advantage in electronic device 200A.

Embodiment 3

Figure 8:
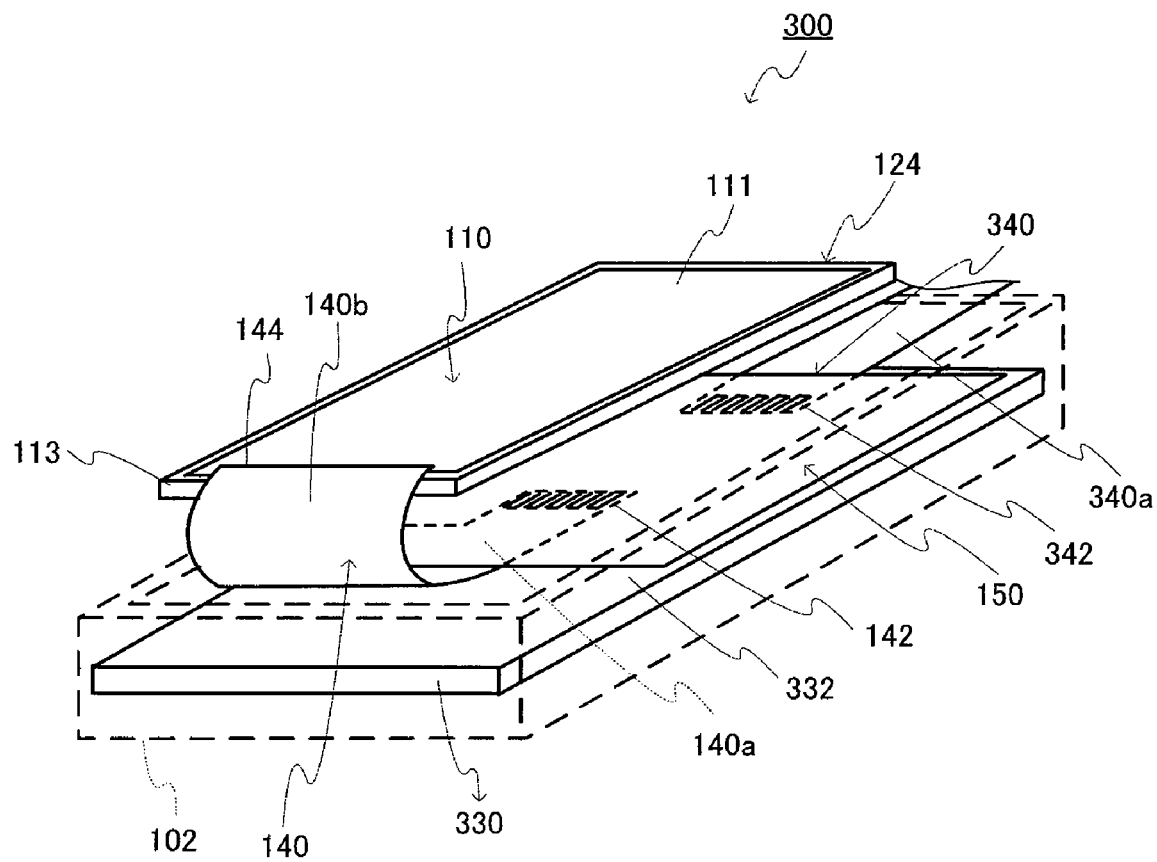
FIG. 8 is a partial exploded perspective view showing a liquid crystal display module and a main substrate arranged in an electronic device according to Embodiment 3 of the present invention.
Figure 9:
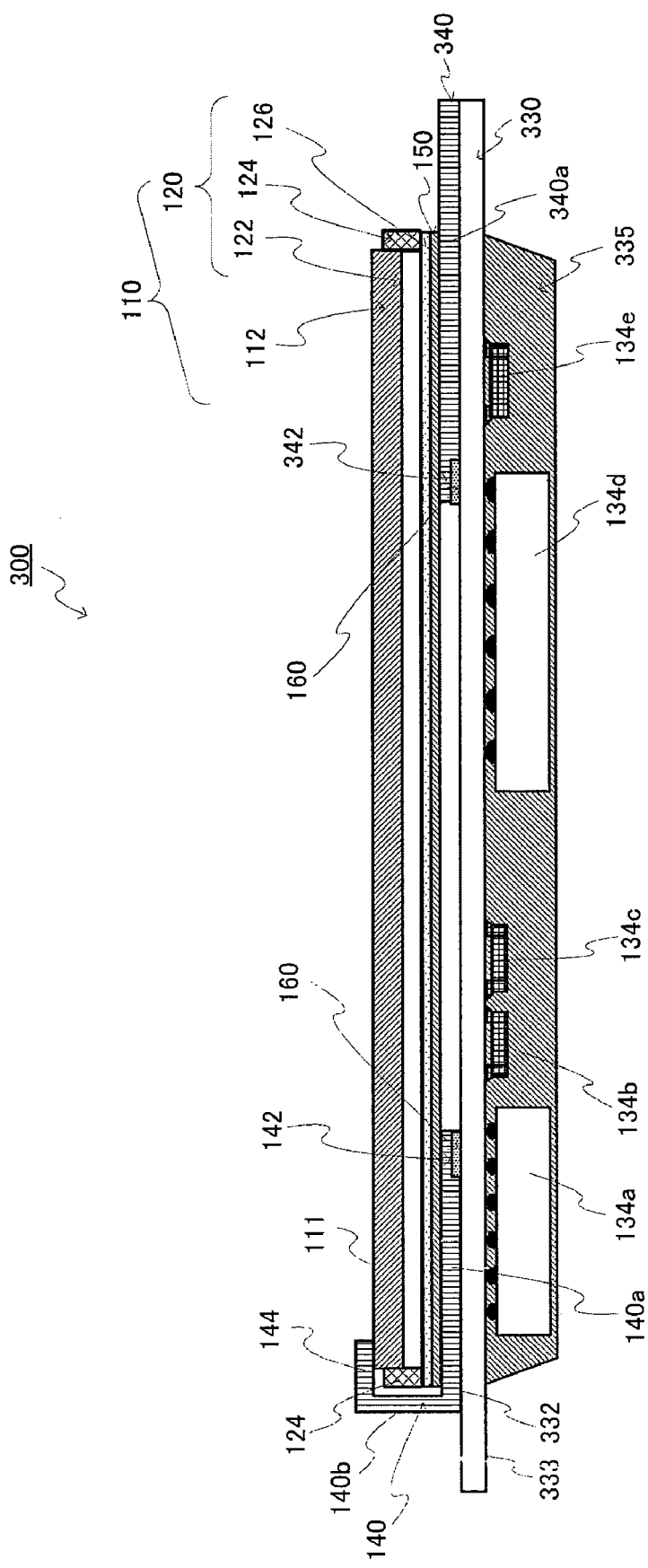
FIG. 9 is a partial cross-sectional view showing the liquid crystal display module and the main substrate provided in the electronic device according to Embodiment 3 of the present invention.

FIG. 8 is a partial exploded perspective view showing a liquid crystal display module and a main substrate arranged in an electronic device according to Embodiment 3 of the present invention, and FIG. 9 is a partial cross-sectional view showing the liquid crystal display module and the main substrate provided in the electronic device according to Embodiment 3 of the present invention.

Further, compared to corresponding electronic device 100 according to Embodiment 1 shown in FIG. 1 and FIG. 2, electronic device 300 shown in FIG. 8 and FIG. 9 differs only in further having FPC 340 and the configuration of the main substrate, and has virtually the same basic configuration. Hereinafter, the same components will be assigned the same reference numerals, and explanation thereof will be omitted.

In electronic device 300, FPCs 140 and 340 connected with the surface of main substrate 330 are provided between liquid crystal display unit 110 which includes reflecting sheet 126 in its back surface and main substrate 330 in which electronic components 134*a* to 134*d* are mounted on its mounting surface that is the back surface. Further, protective sheet 150 is provided between reflecting sheet 126, and FPCs 140 and 340.

In other words, with electronic device 300, liquid crystal display unit 110 is overlaid and disposed on protective sheet 150 on one surface 330*a* side of main substrate 330 disposed inside housing 102. Further, FPC 140 connected to liquid crystal display unit 110 and other FPC 340 are arranged between these main substrate 330 and protective sheet 150.

As shown in FIG. 9, one end part 340*a* of other FPC 340 is arranged along surface 332 of main substrate 330. Connecting terminal part 342 is formed at the tip of this one end part 340*a*, and connecting terminal part 342 is electrically connected to the connecting part provided on surface 332 through ACFs 160.

This connecting part is electrically connected to electronic components 134*a* to 134*e* mounted on surface 333 (i.e. back surface) opposite to surface 332 that is the surface of main substrate 330 on the liquid crystal display unit 110 side. That is, main substrate 330 is a single surface-mount substrate that uses its back surface for mounting surface 333, and the entire surfaces of electronic components 134a to 134d mounted on this mounting surface 333 (i.e. back surface) are covered by insulating, laminated molded part 335. Further, the connecting part provided on the surface 332 side of main substrate 330 and the wiring portion on which electronic components 134a to 134e are mounted on the mounting surface 333 side are connected by throughholes as in Embodiment 1. Further, instead of covering the entire surfaces of electronic components 134a to 134d, part of electronic components 134a to 134d may be exposed.

Mold part 335 is attached on mounting surface 333 of main substrate 330, including electronic components 134a to 134d in order to protect electronic components 134a to 134d. Mold part 335 makes the surface on a side that is parallel to and spaced apart from the back surface of main substrate 330 a flat surface. Further, the flat surface (also referred to as "surface") has a greater planar area than the area of the glass surface (i.e. glass of liquid crystal display module 112) sandwiching the liquid crystal cell part in liquid crystal display unit 110.

As described above, main substrate 330 is further reinforced by mold part 335 to function as one flat structure, receives liquid crystal display unit 110 laminated on protective sheet 150, on its surface inside housing 102 and, consequently, can support liquid crystal display unit 110. That is, electronic device 300 according to the present embodiment can provide the same advantage as the electronic device according to Embodiment 1, and can be made thinner without providing, inside housing 102, separate support members such as magnesium frames that support liquid crystal display unit 110.

Particularly, the surface of mold part 335 can receive liquid crystal display unit 110 laminated on the opposite side of the surface of mold part 335, so that main substrate 330 can secure the strength of glass in electronic device 300.

Further, electronic device 300 may employ a configuration in which notches matching the shapes of part 140a and 340a of FPCs 140 and 340 arranged on main substrate 330 are formed in protective sheet 150, and parts 140a and 340a of FPCs 140 and 340 are arranged inside these notches. This configuration can provide the same advantage as the configuration in which notches are made in protective sheet 150 in electronic device 100 according to Embodiment 1.

Embodiment 4

Figure 10:
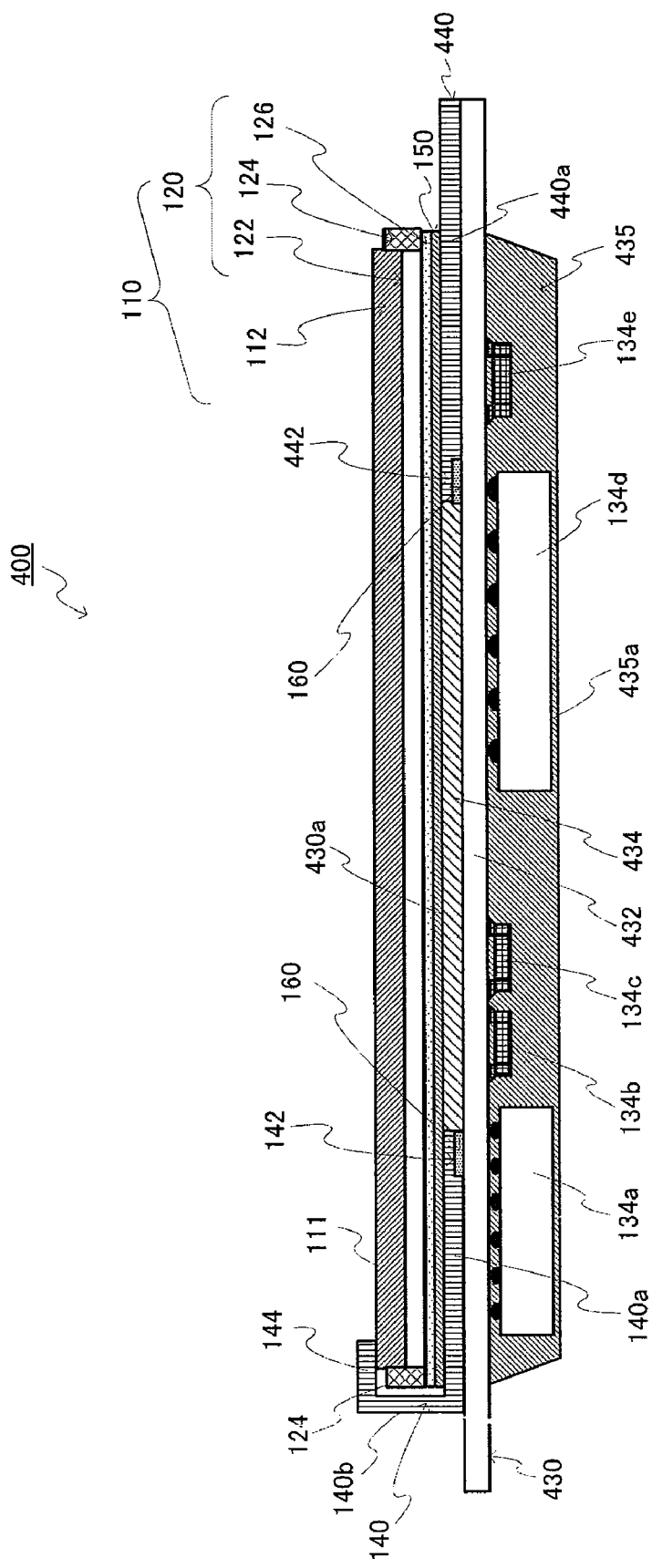
FIG. 10 is a partial cross-sectional view showing a liquid crystal display module and a main substrate provided in an electronic device according to Embodiment 4 of the present invention.

FIG. 10 is a partial cross-sectional view showing a liquid crystal display module and a main substrate provided in an electronic device according to Embodiment 4 of the present invention. Further, similar to corresponding electronic device 100 according to Embodiment 1 shown in FIG. 1 and FIG. 2, this electronic device 400 is a mobile terminal such as a mobile telephone having liquid crystal display unit 110 including liquid crystal display module 112. Note that the same components of electronic device 400 as in electronic device 100 will be assigned the same reference numerals, and explanation thereof will be omitted.

Electronic device 400 employs the same basic configuration as electronic device 100, and, inside housing 102, main substrate 430 and liquid crystal display unit 110 connected to main substrate 430 through FPC 140 are laminated and arranged on the other sides of protective sheet 150.

One end parts 140a and 440a of two FPCs 140 and 440 extending in a direction apart from each other, along the direction in which main substrate 430 extends, are connected to this main substrate 430 of electronic device 400 in a state where end parts 140a and 440a are spaced apart from each other. Further, FPC 440 is the same as other FPC 340 in Embodiment 3, and therefore explanation thereof will be omitted.

Main substrate 430 is formed in a flat, rectangular shape similar to main substrate 130, and notch parts matching the shapes of one end parts 140a and 440a of FPCs 140 and 440 to be overlaid on main substrate 430 are formed in surface 430a on which liquid crystal display unit 110 is placed. Inside these notch parts, FPCs 140 and 440 are arranged along the bottom surfaces of the notch parts. Connecting terminal parts 142 and 442 in these FPC 140 and other FPC 440 are connected through ACFs 160 by surface contact with the connecting parts disposed inside the notch parts.

Here, in main substrate 430, the notch parts formed in main substrate 430 are formed by cutting laminated coverlay 434 applied to the surface of flat, rectangular base material 432 (i.e. insulating plate) made of an insulating member on which liquid crystal display unit 110 is placed.

The connecting portions formed by connecting terminal parts 142 and 442 of FPC 140 and 440, ACFs 160 and the connecting part of main substrate 430 are accommodated in the thickness of main substrate 430.

This prevents FPCs 140 and 440 connected to main substrate 430, from projecting toward liquid crystal display unit 110 beyond the surface of main substrate 430, and makes virtually flat the surface of main substrate 230 connected to FPCs 140 and 440. Further, similar to main substrate 230 according to Embodiment 2, in main substrate 430, it is equally possible to form the notch parts accommodating FPCs 140 and 440 only in coverlay 434 applied to the base material. Furthermore, in main substrate 430, it is equally possible to form notch parts accommodating FPCs 140 and 440 by making the thickness of the coverlay applied to the base material thicker.

As described above, similar to electronic device 100, liquid crystal display unit 110 is disposed on protective sheet 150 on the surface of main substrate 430 to which FPCs 140 and 440 are connected through ACFs 160.

That is, with this electronic device 400, FPCs 140 and 440 connected to the surface of main substrate 430 are provided between liquid crystal display unit 110 which includes reflecting sheet 126 in its back surface and main substrate 430 which arranges its surface to face reflecting sheet 126 and in which electronic components 134a to 134e are mounted on the mounting surface that is the back surface. Further, protective sheet 150 is provided between reflecting sheet 126 and FPC 140.

Furthermore, liquid crystal display unit 110 is the same as liquid crystal display unit 110 according to Embodiment 1, and therefore explanation thereof will be omitted.

Protective sheet 150 in electronic device 400 is attached so as to cover the connecting portions of FPCs 140 and 440 and cover at least the display area in the surface of liquid crystal display unit 110 for reflecting sheet 126 forming the back surface of liquid crystal display unit 110. Here, in main substrate 430, protective sheet 150 is laid over the entire surface of the part facing liquid crystal display unit 110.

Further, similar to main substrate 330 according to Embodiment 3, main substrate 430 uses its back surface for the mounting surface, and, on this mounting surface, electronic components 134a to 134e are mounted. These electronic components 134a to 134e are covered by insulating, laminated mold part 435.

Similar to mold part 335, this mold part 435 is attached on main substrate 430, including electronic components 134a to 134d in order to protect electronic components 134a to 134d. Similar to Embodiment 3, mold part 435 makes surface 435a that is parallel to and spaced apart from the back surface of main substrate 430 a flat surface.

With electronic device 400 according to Embodiment 4, mold part 435 is included in one surface (i.e. back surface) that is the mounting surface, and FPCs 140 and 440 are connected with main substrate 430 on the surface side that is opposite to the mounting surface. Further, FPC 140 led out from the surface of main substrate 430 along this surface is folded back, so that liquid crystal display unit 110 that includes reflecting sheet 126 in its back surface is laminated and arranged on protective sheet 150 on surface 430a on the opposite side of main substrate 430.

Consequently, reflecting sheet 126 of liquid crystal display unit 110 is arranged on the portions for connecting main substrate 430 with FPCs 140 and 440 that are made smooth by protective sheet 150, and is not damaged by the steps of the connecting portions.

Further, main substrate 430 is further reinforced by mold part 435 to function as one flat structure, receives liquid crystal display unit 110 laminated on protective sheet 150, on its surface inside housing 102 and thereby supports liquid crystal display unit 110.

Consequently, electronic device 400 according to the present embodiment can provide the same advantage as the electronic device according to Embodiment 1, and can be made thinner without providing, inside housing 102, separate support members such as magnesium frames that support liquid crystal display unit 110.

Further, the surface of mold part 435 that is spaced apart from main substrate 430 and that is parallel to and spaced apart from the back surface of main substrate 430 includes a larger planar area than the area of the glass surface sandwiching the liquid crystal cell part in liquid crystal display unit 110.

Consequently, the surface of the mold part can receive liquid crystal display unit 110 laminated on the opposite side of the surface of the mold part, so that main substrate 430 can secure the strength of glass in electronic device 400.

Further, electronic device 400 may employ a configuration in which notches matching the shapes of parts 140a and 440a of FPCs 140 and 440 are formed inside the notch parts of main substrate 430, and parts 140a and 440a of FPCs 140 and 440 are arranged inside these notches. According to this configuration, in case where FPCs 140 and 440 project toward liquid crystal display unit 110 from surface 430a of main substrate 430, protective sheet 150 absorbs these projecting portions, thereby making the surfaces of FPCs 140 and 440 coplanar with the surface of protective sheet 150. That is, it is possible to make flat the surface on which reflecting sheet 126 of liquid crystal display unit 110 arranged on protective sheet 150 on main substrate 430 is placed, arrange liquid crystal display unit 110 on main substrate 430 without damaging reflecting sheet 126 and make housing 102 thinner and smaller.

Figure 11:
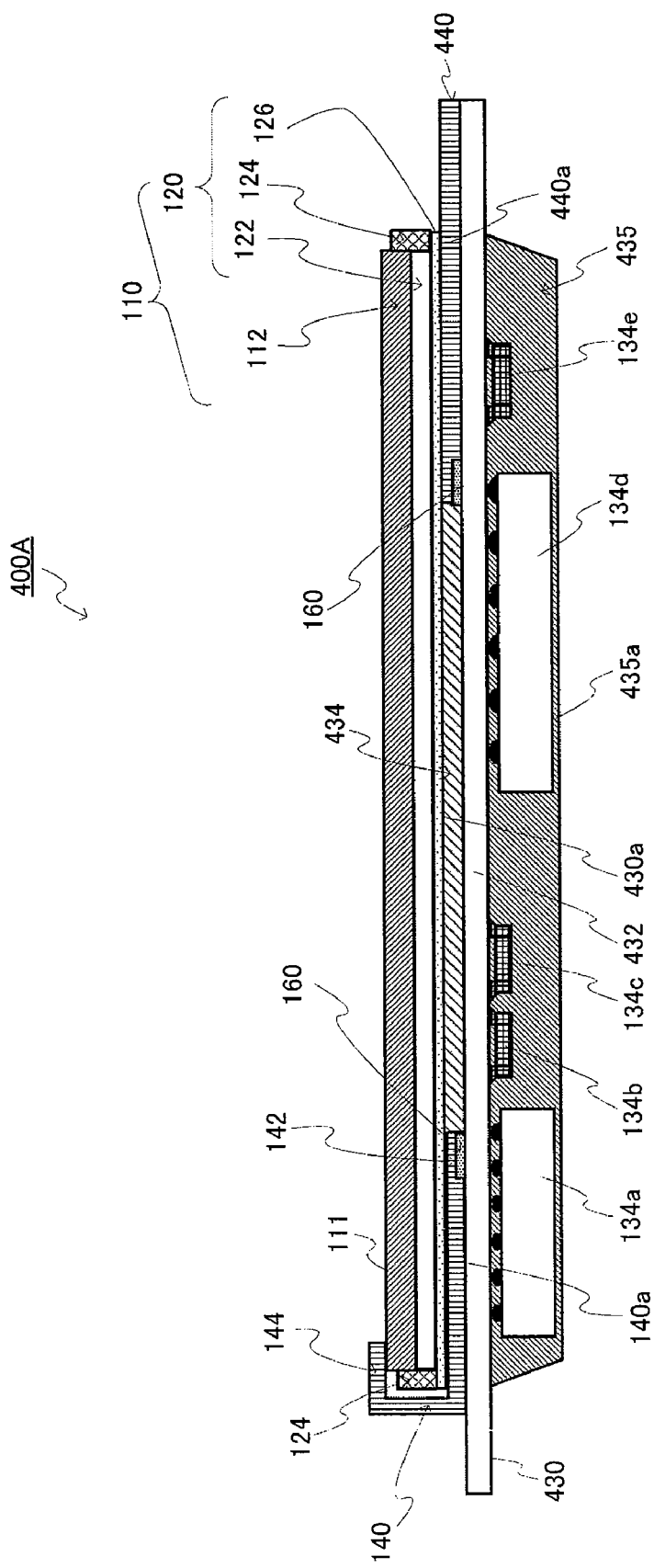
FIG. 11 is a main part partial cross-sectional view showing a configuration of the electronic device as a modified example of Embodiment 4 of the present invention.

Further, electronic device 400 according to Embodiment 4 may employ a configuration without protective sheet 150 as shown in FIG. 11.

FIG. 11 is a main part cross-sectional view showing a configuration of the electronic device as a modified example of Embodiment 4 of the present invention.

In electronic device 400A shown in FIG. 11, liquid crystal display unit 110 is directly placed on main substrate 430 disposed inside housing 102.

In this electronic device 400A, liquid crystal display unit 110 is overlaid and arranged directly on the surface of main substrate 430 in which FPCs 140 and 440 are disposed inside notch parts formed by cutting coverlay 434 on base material 432.

According to this configuration, the connecting portions connecting main substrate 430 with FPCs 140 and 440 through ACFs 160 are disposed in the range of the thickness of main substrate 430, without projecting from the surface of main substrate 430. Further, FPCs 140 and 440 connected to main substrate 430 through the connecting portions are connected to parts on the surface side of liquid crystal display unit 110 through other end parts that are led out from the notch parts, that is, from the layer of coverlay 434, and that are folded back.

As described above, FPCs 140 and 440 provided between main substrate 430 and liquid crystal display unit 110 are arranged in the range of the thickness of main substrate 430 that includes base material 432a and coverlay 434, without projecting toward liquid crystal display unit 110 from surface 430a.

By this means, liquid crystal display unit 110 laminated directly on main substrate 430 is arranged on virtually the smooth surface of main substrate 430. Consequently, even if reflecting sheet 126 forming the back surface of liquid crystal display unit 110 is placed on main substrate 430 connected to FPCs 140 and 440 on the surface side, reflecting sheet 126 is not damaged by the corner parts of the steps formed by the thickness of FPCs 140 and 440 on the surface side of main substrate 430 and allows the backlight module to perform adequate surface emission. Further, in electronic device 400A, the configuration of notch parts of main substrate 430 may be formed by making coverlay 434 thicker with respect to base material 432.

Furthermore, similar to electronic device 400, with electronic device 400A, surface 435a of mold part 435 can receive liquid crystal display unit 110 laminated on the opposite side of the surface of the mold part, so that main substrate 430 can secure the strength of glass in electronic device 400A.

As described above, electronic devices 100, 200, 200A, 300, 400 and 400a according to these embodiments can maintain good display performance of liquid crystal display module 110 and can be made thinner in a configuration in which liquid crystal display module 110 having reflecting sheet 126 in its back surface is mounted.

Note that the electronic device according to the present invention is not limited to the above embodiments, and can be variously modified.

Further, the notch parts may be formed by making thicker the coverlay applied to the surface of the base material in the main substrate.

Further, electronic devices 300 and 400 according to Embodiments 3 and 4 employ a configuration in which liquid crystal display unit 110 is overlaid and disposed on protective sheet 150 on the surface opposite to the mounting surface of the substrate (i.e. main substrate 330 or 430) in which mounted electronic components 134a to 134e are covered by mold part 335 or 435. In addition, in each electronic device, a liquid crystal display unit having the same function as liquid crystal display unit 110 may be overlaid and disposed on protective sheet 150 on the surface on which mold part 335 or 435 is provided in the substrate. In other words, liquid crystal display unit 110 that includes a reflecting sheet in its back surface, is overlaid and arranged on the main substrate on which protective sheet 150 is laid. Further, in case where liquid crystal display unit 110 is laminated on protective sheet 150 on the surface of mold part 335 or 435, the shape of the surface of mold part 335 or 435 is formed in a planar shape larger than the area of the glass surface of liquid crystal display unit 100 such that the force to make the glass surface of laminated liquid crystal display unit 110 bow is applied.

Further, although the main substrate and the end parts of FPCs are connected using ACF 140 in electronic devices 100, 200, 200A, 300, 400 and 400A according to the present embodiment, the present invention is not limited to this, and the main substrate and the end parts of FPCs may be connected in any way as long as the thickness of the connecting portion connecting the main substrate and the end parts of FPCs becomes as thin as possible. For example, instead of connecting the main substrate and the end parts of FPCs using a connector, the main substrate and the end parts of FPCs may be connected by flash soldering to make the thickness of the connecting portions of the main substrate and the end parts of FPCs thin as much as possible.

Further, protective sheet 150 according to each embodiment may be a radiowave absorption sheet. A radiowave absorption sheet is made by mixing carbon, ferrite powders or various alloy powders having radiowave absorption characteristics in rubber to mold into a sheet. By adopting a radiowave absorption sheet for protective sheet 150 in electronic devices 100, 200, 300 and 400 according to each embodiment in this way, it is possible to reduce noise radiated from an LCD that has negative influences upon electronic devices, a substrate and parts mounted on the substrate, or noise entering from outside.

Similar to main substrate 330 and 430 according to Embodiments 3 and 4, main substrates 130, 230 and 230A in electronic devices 100, 200 and 200A may use the mold part to cover electronic components 134a to 134d to be mounted. In this case, it is possible to provide the same advantage as in electronic devices 300, 400 and 400A that include mold parts 335 and 435.

Further, similar to electronic device 100, electronic devices 200, 200A, 300, 400 and 400A can be applied to mobile terminals such as mobile phones that have liquid crystal display unit 110 with a liquid crystal display module.

The disclosure of Japanese Patent Application No. 2007-340768, filed on Dec. 28, 2007, including the specification, drawings and abstract, is incorporated herein by reference in its entirety.

INDUSTRIAL APPLICABILITY

The electronic device according to the present invention provides an advantage of making the electronic device thinner while maintaining good display performance of a liquid crystal display module, and is useful as a mobile terminal apparatus such as a mobile telephone that has a liquid crystal display unit.

The invention claimed is:

1. A mobile terminal apparatus comprising:
    a substrate;
    a flexible substrate which is connected to a surface of the substrate;
    an electronic component which is mounted on a back surface of the substrate;
    a mold part which covers the electronic component;
    a liquid crystal display unit which comprises a glass surface and a reflecting sheet, and which is arranged on a surface side of the substrate; and
    a protective sheet which is provided between the reflecting sheet and the flexible substrate and which covers a step formed by a thickness of the flexible substrate,
    wherein the mold part has an area larger than an area of the glass surface of the liquid crystal display unit.

2. The mobile terminal apparatus according to claim 1, wherein the flexible substrate is connected to the surface of the substrate using an isotropic conductive film.

3. The mobile terminal apparatus according to claim 1, wherein the flexible substrate is connected to the liquid crystal display unit.

4. The mobile terminal apparatus according to claim 3, wherein the flexible substrate comprises a lead-out part that is led outward between the liquid crystal display unit and the substrate connected with the flexible substrate and is bent toward the display surface of the liquid crystal display unit.

5. The mobile terminal apparatus according to claim 1, wherein the flexible substrate is formed with a first flexible substrate and a second flexible substrate.

6. The mobile terminal apparatus according to claim 5, wherein the first flexible substrate is connected to the liquid crystal display unit.

7. The mobile terminal apparatus according to claim 6, wherein the first flexible substrate comprises a lead-out part that is led outward between the liquid crystal display unit and the substrate connected with the flexible substrate and is bent toward the display surface side of the liquid crystal display unit.

8. The mobile terminal apparatus according to claim 1, wherein the protective sheet has a same surface area as a display area of a display surface of the liquid crystal display unit, and covers an area of the reflecting sheet matching the display area of the display surface.

9. A mobile terminal apparatus comprising:
    a substrate;
    a flexible substrate which is connected to a surface of the substrate;
    an electronic component which is mounted on a back surface of the substrate;
    a liquid crystal display unit which comprises a reflecting sheet and which is arranged on a surface side of the substrate; and
    a protective sheet which contacts the reflecting sheet and is attached on the surface of the substrate so as to cover a step formed by a thickness of the flexible substrate.

10. The mobile terminal apparatus according to claim 9, further comprising a mold part which covers the electronic component.

* * * * *